United States Patent
Wang et al.

(10) Patent No.: US 11,482,520 B2
(45) Date of Patent: Oct. 25, 2022

(54) SEMICONDUCTOR DEVICE AND ELECTROSTATIC DISCHARGE PROTECTION METHOD

(71) Applicant: MACRONIX INTERNATIONAL CO., LTD., Hsinchu (TW)

(72) Inventors: Shih-Yu Wang, Taipei (TW); Wen-Tsung Huang, Changhua County (TW); Chih-Wei Hsu, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 255 days.

(21) Appl. No.: 16/840,489

(22) Filed: Apr. 6, 2020

(65) Prior Publication Data
US 2021/0313313 A1    Oct. 7, 2021

(51) Int. Cl.
*H01L 27/02*    (2006.01)
(52) U.S. Cl.
CPC ........ *H01L 27/0285* (2013.01); *H01L 27/027* (2013.01); *H01L 27/0292* (2013.01)
(58) Field of Classification Search
None
See application file for complete search history.

(56) References Cited

U.S. PATENT DOCUMENTS

| | | | |
|---|---|---|---|
| 9,437,591 B1* | 9/2016 | Nidhi | H01L 27/0262 |
| 2006/0022272 A1* | 2/2006 | Chen | H01L 27/0266 |
| | | | 257/358 |
| 2015/0077888 A1* | 3/2015 | Galy | H02H 9/044 |
| | | | 361/56 |
| 2017/0012036 A1* | 1/2017 | Quax | H01L 29/87 |
| 2018/0247927 A1* | 8/2018 | Lai | H02H 9/04 |
| 2020/0176441 A1* | 6/2020 | Gorbachov | H01L 27/0288 |
| 2021/0098445 A1* | 4/2021 | Lin | H01L 27/0285 |

* cited by examiner

*Primary Examiner* — Benjamin P Sandvik
(74) *Attorney, Agent, or Firm* — McClure, Qualey & Rodack, LLP

(57) ABSTRACT

The present disclosure relates to a semiconductor device, including a first source/drain region, a second source/drain region, a base region, a first electrostatic discharge region and a second electrostatic discharge region. The first source/drain region and the second source/drain region are configured to receive a first power voltage and a second power voltage, and are formed on the base region. The first electrostatic discharge region includes a first doped region and a first well. The first doped region is configured to receive the second power voltage, and formed in the first well. The second electrostatic discharge region includes a second doped region and a second well. The second doped region is configured to receive the first power voltage, and formed in the second well. The first source/drain region and the second source/drain region are disposed between the first electrostatic discharge region and the second electrostatic discharge region.

17 Claims, 5 Drawing Sheets

SEMICONDUCTOR DEVICE AND ELECTROSTATIC DISCHARGE PROTECTION METHOD

BACKGROUND

Technical Field

The present disclosure relates to a semiconductor device and an electrostatic discharge protection method, especially a technique for discharging electrostatic charges from a semiconductor element to the outside.

Description of Related Art

In the design of the semiconductor devices, due to human body discharge or machine discharge, the electrostatic current caused by "electrostatic discharge (ESD)" event easily causes damage to the internal circuit. Therefore, an electrostatic discharge protection path needs to be provided in the semiconductor device to achieve the purpose of electrostatic discharge protection.

SUMMARY

One aspect of the present disclosure is a semiconductor device, including a first source/drain region, a second source/drain region, a base region, a first electrostatic discharge region and a second electrostatic discharge region. The first source/drain region is configured to receive a first power voltage. The second source/drain region is configured to receive a second power voltage. The first source/drain region and the second source/drain region are formed on the base region. The first electrostatic discharge region includes a first doped region of a first type and a first well of a second type. The first doped region is formed in the first well. The second electrostatic discharge region includes a second doped region of the first type and a second well of the second type. The second doped region is formed in the second well. The first source/drain region and the second source/drain region are disposed between the first electrostatic discharge region and the second electrostatic discharge region.

Another aspect of the present disclosure is an electrostatic discharge protection method, including: conducting a first electrostatic discharge path between a first doped region of a first type and a first source/drain region of a second type, wherein a base region of the first type and a first well of the second type are coupled between the first doped region and the first source/drain region; and conducting a second electrostatic discharge path between a second doped region of the first type and a second source/drain region of the second type, wherein the base region and a second well of the second type are coupled between the second doped region and the second source/drain region.

Another aspect of the present disclosure is a semiconductor device, including a voltage control element and a first control circuit. The voltage control element includes a first source/drain region, a second source/drain region and a gate region. The first source/drain region is configured to receive a first power voltage, and the second source/drain region is configured to receive a second power voltage. The first control circuit includes a receiving circuit and a control switch. The receiving circuit is configured to receive the first power voltage and the second power voltage. The receiving circuit is further configured to output a first control voltage according to a higher one of the first power voltage and the second power voltage. The control switch is turned on in response to the first power voltage to output the first control voltage to the gate region of the voltage control element.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
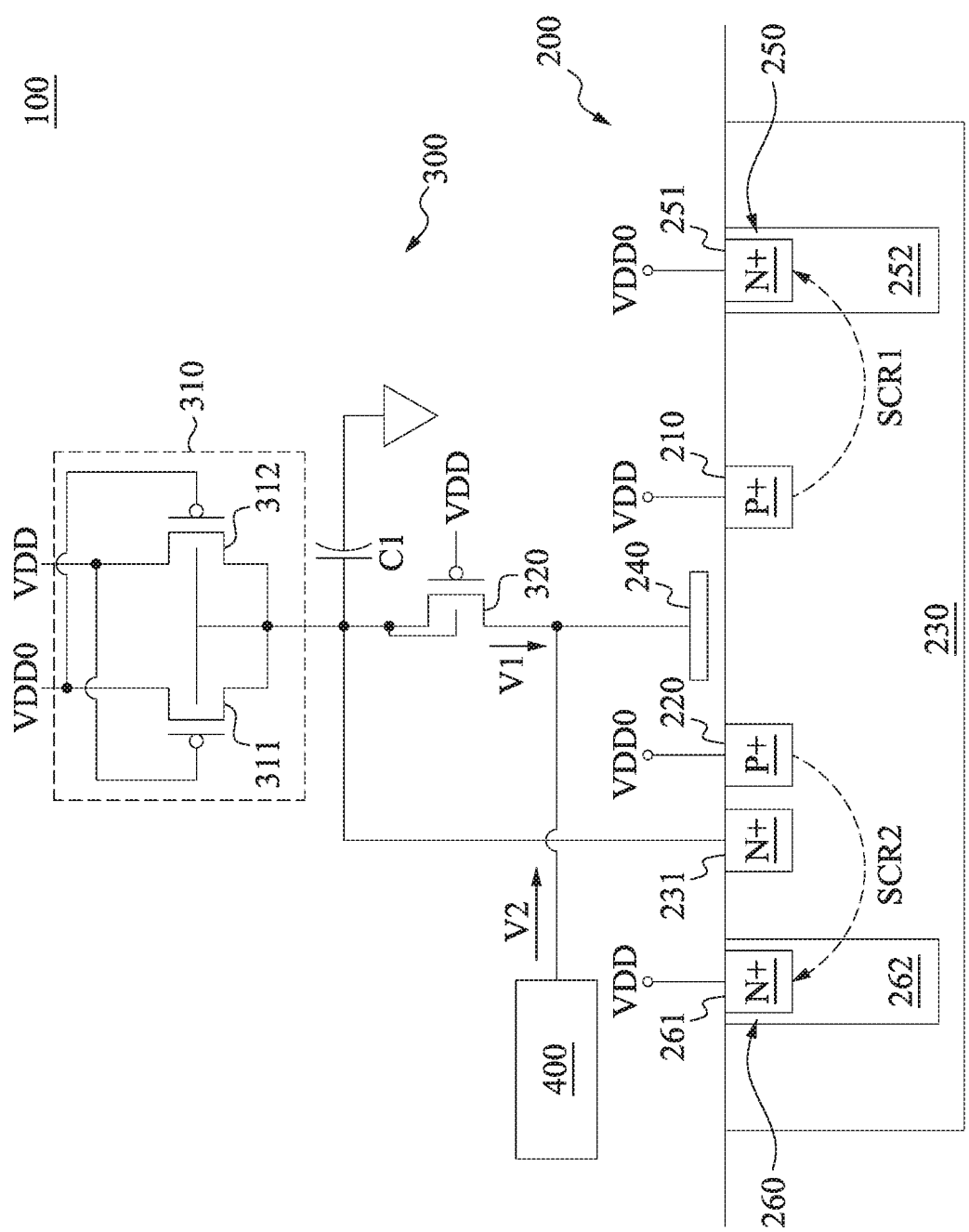
FIG. 1 is a schematic diagram of a semiconductor device in some embodiments of the present disclosure.

This disclosure relates to a semiconductor device and an electrostatic discharge protection method. Referring to FIG. 1, the semiconductor device 100 includes a voltage control element 200. The voltage control element 200 includes a first source/drain region 210, a second source/drain region 220, a base region 230, a first electrostatic discharge region 250 and a second electrostatic discharge region 260. The first source/drain region 210 is configured to receive a first power voltage VDD. The second source/drain region 220 is configured to receive a second power voltage VDD0. The first source/drain region 210 and the second source/drain region 220 are formed in the base region 230.

In some embodiments, the voltage control element 200 also includes a gate region 240. The gate region 240 is disposed above the first source/drain region 210 and the second source/drain region 220, and is between the first source/drain region 210 and the second source/drain region 220. In some embodiments, the first source/drain region 210 and the second source/drain region 220 are P-type doped regions, and the base region 230 is an N-type doped region. As a result, the first source/drain region 210, the second source/drain region 220, the base region 230 and the gate region 240 can be used to operate together as a P-type metal oxide semiconductor field effect transistor (PMOS). In some embodiments, the "source/drain region" means that it may be used as a source region or a drain region. For example, when the first source/drain region 210 is used as the "source" of PMOS, the second source/drain region 220 is used as the "drain" of PMOS. Similarly, when the first source/drain region 210 is used as the "drain" of PMOS, the second source/drain region 220 is used as the "source" of PMOS.

In order to clearly discuss the present disclosure, the following embodiments are described, for example, by providing the first source/drain region 210, the second source/drain region 220, the base region 230 and the gate region 240 that are operated together as the PMOS, but the present disclosure is not limited thereto. Alternatively stated, in some other embodiments, the first source/drain region 210, the second source/drain region 220, the base region 230 and the gate region 240 may also be configured to implement an N-type metal oxide semiconductor field effect transistor.

In operation, when the voltage control element 200 operates in the "triode saturation" of the transistor, according to the voltage level received by the gate region 240, the voltage control element 200 has different impedance characteristics, and the cross-voltage between the first source/drain region 210 and the second source/drain region 220 will change accordingly. In some embodiments, the semiconductor device 100 may be applied to a linear drop regulator (LDO). In operation, the voltage control element 200 is configured to receive the first power voltage VDD and output the second power voltage VDD0. The second power voltage VDD0 will be slightly lower than the first power voltage VDD, but the present disclosure is not limited to this.

As shown in FIG. 1, the POMS is disposed between the first electrostatic discharge region 250 and the second electrostatic discharge region 260. Alternatively stated, the first source/drain region 210 and the second source/drain region 220 are disposed between the first electrostatic discharge region 250 and the second electrostatic discharge region 260. Accordingly, the first source/drain region 210 and the second source/drain region 220 form electrostatic discharge paths with the first electrostatic discharge region 250 and the second electrostatic discharge region 260, respectively.

The first electrostatic discharge region 250 includes a first doped region 251 of N-type and a first well 252 of P-type. The first doped region 251 is configured to receive the second power voltage VDD0, and is formed in the first well 252. The second electrostatic discharge region 260 includes a second doped region 261 of N-type and a second well 262 of P-type. The second doped region 261 is configured to receive the first power voltage VDD, and is formed in the second well 262.

As shown in FIG. 1, the first source/drain region 210, the base region 230, the first well 252 and the first doped region 251 form a "P-N-P-N" semiconductor structure. This semiconductor structure may be equivalent to a Silicon Controlled Rectifier (SCR) as a first electrostatic discharge path SCR1. Alternatively stated, in an electrostatic discharge state, a first electrostatic discharge current will be input to the semiconductor device 100 from the first source/drain region 210, and output from the first electrostatic discharge region 250.

Similarly, the second source/drain region 220, the base region 230, the second well 262 and the second doped region 261 may form an SCR structure and a second electrostatic discharge path SCR2. In an electrostatic discharge state, a second electrostatic discharge current will be input to the semiconductor device 100 from the second source/drain region 220, and output from the second electrostatic discharge region 260.

In some embodiments, the first well 252 and the second well 262 are formed in the base region 230. In some embodiments, the base region 230 may be implemented in a doped well region of N type.

Referring to FIG. 1, in some embodiments, the semiconductor device 100 also includes a first control circuit 300. The first control circuit 300 includes a receiving circuit 310 and a control switch 320. The receiving circuit 310 is configured to receive the first power voltage VDD and the second power voltage VDD0. The receiving circuit 310 is also configured to output a first control voltage V1 according to a higher one of the first power voltage VDD and the second power voltage VDD0. The control switch 320 is turned on in response to the first power voltage VDD to output the first control voltage V1 to the gate region 240 of the voltage control element 200. In this embodiment, the control switch 320 is a P-type transistor. Therefore, when the first power voltage VDD has high voltage level, the control switch 320 will be turned off according to the first power voltage VDD. On the other hand, when the first power voltage VDD has low voltage level, the control switch 320 will be turned on according to the first power voltage VDD.

In some embodiments, the semiconductor device 100 also includes a second control circuit 400. The second control circuit 400 is configured to transmit a second control voltage V2 to the gate region 240 to control the voltage level of the gate region 240. In some embodiments, the second control circuit 400 is an operating circuit in a linear drop regulator, which includes an error amplifier (or operational amplifier for error detection) (not shown in the figure) and a feedback circuit (not shown in the figure), which are respectively coupled to the first power voltage VDD and the second power voltage VDD0. In operation, the second control circuit 400 is configured to detect the level of the second power voltage VDD0 to dynamically adjust the second control voltage V2 that is output to the gate region 240. Accordingly, the second control circuit 400 may adjust the impedance characteristics of the voltage control element 200. One of ordinary skill in the art can understand the circuit structure and principle of linear regulator, and thus they are not further detailed herein.

In some embodiments, the first control circuit 300 is configured to ensure that the voltage control element 200 is completely turned off when the semiconductor device 100 is not required to operate. Accordingly, the diode structure in the voltage control element 200 can be avoided from generating a leakage path therein. The following describes operations of the first control circuit 300 when the semiconductor device 100 is in different operating states.

Figure 2:
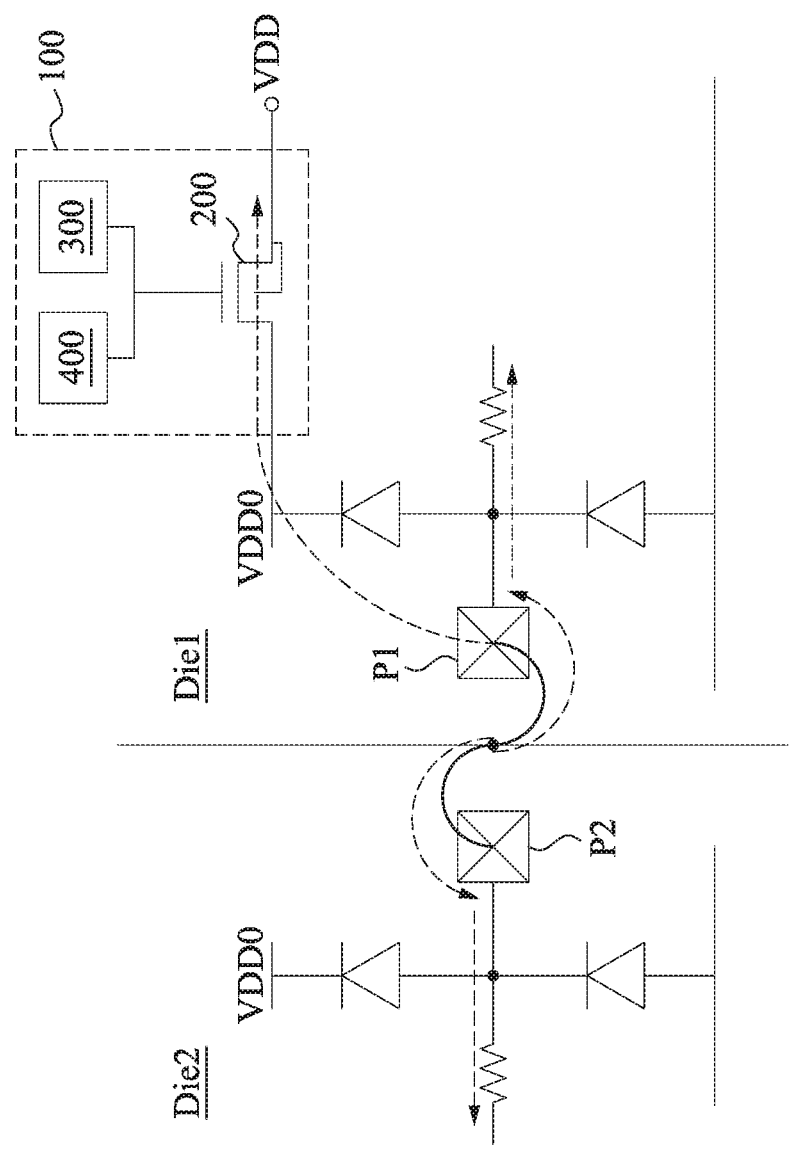
FIG. 2 is a schematic diagram of the semiconductor device used in integrated circuits in some embodiments of the present disclosure.

Referring to FIG. 1 and FIG. 2, in some embodiments, the semiconductor device 100 is applied to a first integrated circuit Die1, and the I/O pad P1 of the first integrated circuit Die1 and the I/O pad P2 of a second integrated circuit Die2 are coupled and shared. In a "normal state", the semiconductor device 100 receives the first power voltage VDD, and the outputs the second power voltage VDD0 which is slightly lower than the first power voltage VDD through the voltage control element 200. As mentioned above, the control switch 320 is turned off in response to the high voltage level of the first power voltage VDD. Therefore, in the "normal state", the first control circuit 300 will not affect the operation of the voltage control element 200. At this time, the impedance characteristic of the voltage control element 200 will change according to the second control voltage V2 output by the second control circuit 400.

On the other hand, in a "shutdown state", the first power voltage VDD may have a ground level or be controlled to have a low voltage level to reduce power consumption. However, as shown in FIG. 2, if the second integrated circuit Die2 is in operation, resulting in a high voltage on the I/O pad P2, the voltage control element 200 need be completely turned off, otherwise the high voltage on the I/O pad P2 will be transferred to the I/O pad P1, forming the second power voltage VDD0 with a high level. At this time, the voltage control element 200 will be reversed, damaging the semiconductor device 100 or affecting the signal accuracy of the second integrated circuit Die2 (as shown in FIG. 2, a dotted path across the voltage control element 200). Through the operation of the first control circuit 300, the present disclosure ensures that the voltage control element 200 is completely turned off during the "shutdown state", as described below.

As mentioned above, referring to FIG. 1, in the "shutdown state", the second power voltage VDD0 is greater than the first power voltage VDD, and the control switch 320 is turned on in response to the low voltage level of the first power voltage VDD. Therefore, the first control circuit 300 outputs a disable voltage (i.e., the second power voltage VDD0 with a relatively high voltage level) to the gate region 240. At this time, since the second source/drain region 220 and the gate region 240 are both applied with the same second power voltage VDD0, no leakage current path will be formed inside the voltage control element 200. In some other embodiments, the first control circuit 300 further outputs the disable voltage to the base region 230 of the voltage control element 200.

In addition, in an "electrostatic discharge state", an electrostatic discharge voltage may be input from the first source/drain region 210 or the second source/drain region 220 to the voltage control element 200. As mentioned above, through the two SCR structures in the voltage control element 200, electrostatic discharge paths (i.e., SCR1 and SCR2) in different directions may be formed to ensure that an electrostatic discharge voltage will not damage the semiconductor device 100.

In some embodiments, the first control circuit 300 also includes a storage element C1. In some embodiments, the storage element C1 is a capacitor. A heavily doped region of N-type is formed in the base region 230 as a buffer region 231. The storage element C1 is coupled to the buffer region 231. In the "electrostatic discharge state", the storage element C1 and the internal equivalent resistance of the first control circuit 300 will form a delay circuit, so that the base region 230 is maintained in a floating state.

In some embodiments, the doping concentration of the buffer region 231 is greater than the doping concentration of the other regions of the base region 230. As shown in FIG. 1, when the first source/drain region 210 or the second source/drain region 220 receives the electrostatic discharge voltage, the electrostatic discharge voltage is transmitted to the storage element C1 through the buffer region 231 of the base region 230, so that the voltage of the base region 230 remains floating during the delay period. In some embodiments, the length of the above delay period is determined according to the storage element C1 and the internal impedance of the first control circuit 300, such as 100 ns-1 ms.

In the foregoing embodiment, the storage element C1 is coupled to the base region 230 through the heavily doped buffer region 231. In some other embodiments, the storage element C1 may also be directly coupled to the base region 230, so that the base region 230 maintains floating when the semiconductor device 100 is in the "electrostatic discharge state".

In some embodiments, the receiving circuit 310 includes a first switch element 311 and a second switch element 312. The first switch element 311 is turned on in response to the first power voltage VDD. A first terminal of the first switch element 311 is configured to receive the second power voltage VDD0, and a second terminal of the first switch element 311 is coupled to the control switch 320. The second switch element 312 is turned on in response to the second power voltage VDD0. A first terminal of the second switch element 312 is configured to receive the first power voltage VDD. A second terminal of the second switch element 312 is coupled to the control switch 320. In addition, in this embodiment, the base of the first switch element 311 and the base of the second switch element 312 are coupled to each other.

Figure 3:
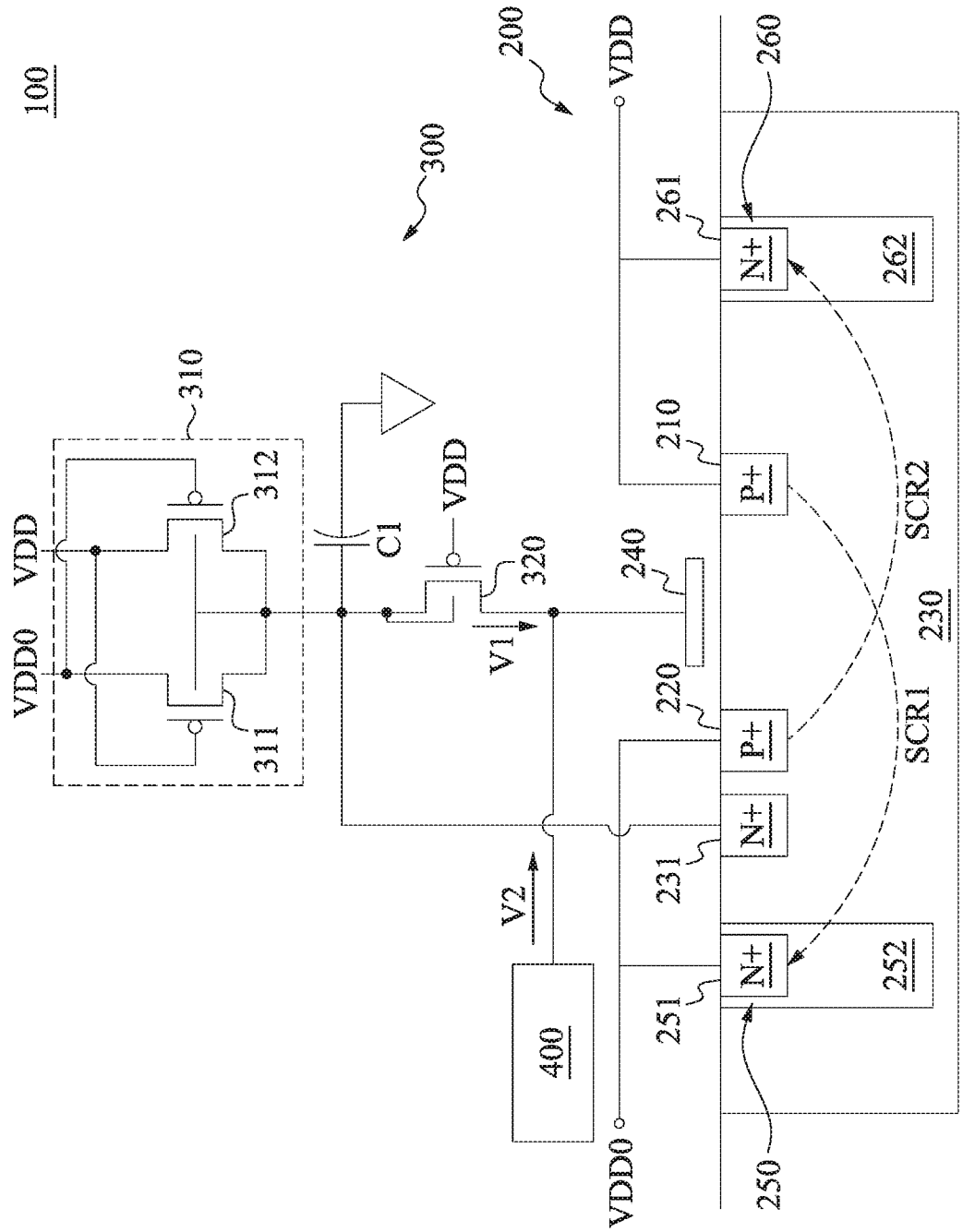
FIG. 3 is a schematic diagram of a semiconductor device in some other embodiments of the present disclosure.

FIG. 3 is a schematic diagram of a semiconductor device in some other embodiments of the present disclosure. Compared to FIG. 1, in this embodiment, the position of the first electrostatic discharge region 250 and the position of the second electrostatic discharge region 260 are mutually reversed, but the structure of voltage control element 200 is substantially the same as that shown in FIG. 1.

Figure 4:
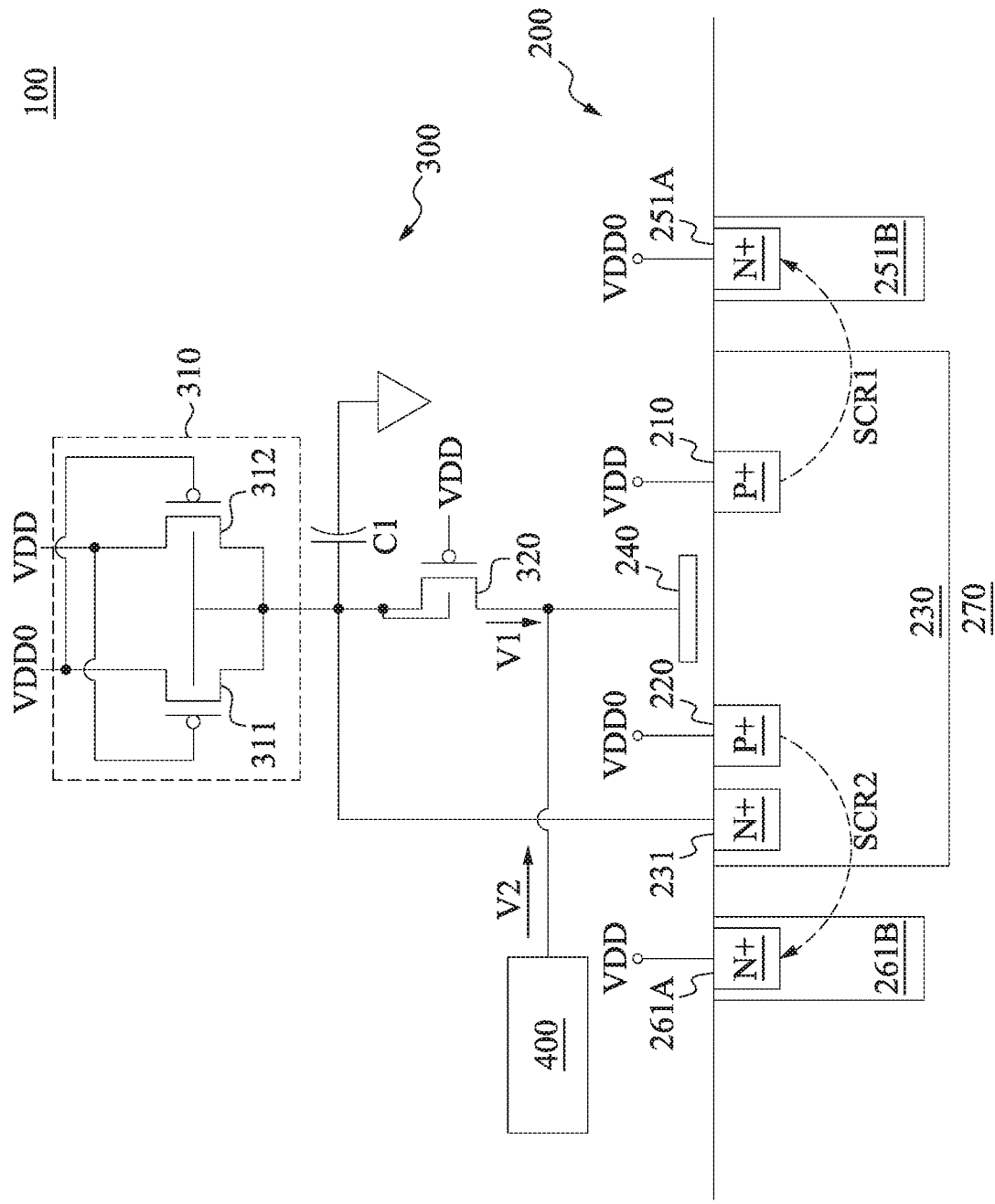
FIG. 4 is a schematic diagram of a semiconductor device in some other embodiments of the present disclosure.

In FIG. 4, the similar components associated with the embodiment of FIG. 1 are labeled with the same numerals for ease of understanding. The specific principle of the similar component has been explained in detail in the previous paragraphs, and unless it has a cooperative relationship with the components of FIG. 4, it is not repeated here.

In some embodiments, the first well 252 and the second well 262 in FIG. 1 above are implemented with the same doped well region. Compared to FIG. 1, as shown in FIG. 4, the semiconductor device 100 includes a doped well region 270 of P-type, wherein the well structure corresponding to the first well 252 and the second well 262 is implemented by the doped well region 270. Alternatively stated, the doped well region 270 may be used as the first well 252 and the second well 262 in FIG. 1 to implement the corresponding semiconductor structure. In addition, as shown in FIG. 4, the base region 230 is also formed in the doped well region 270.

In some embodiments, the doped well region 270 further forms a third well 251B of N-type and a fourth well 261B of N-type. As shown in FIG. 4, the first doped region 251A is formed in the third well 251B, and is coupled to the doped well region 270 through the third well 251B. The second doped region 261A is formed in the fourth well 261B, and is coupled to the doped well region 270 through the fourth well 261B. The third well 251B and the fourth well 261B are used to reduce the equivalent distance from the positive electrode to the negative electrode (e.g., distance between "N-P" or "P-N") in the SCR structure, so as to improve the discharge speed of the electrostatic discharge current.

Figure 5:
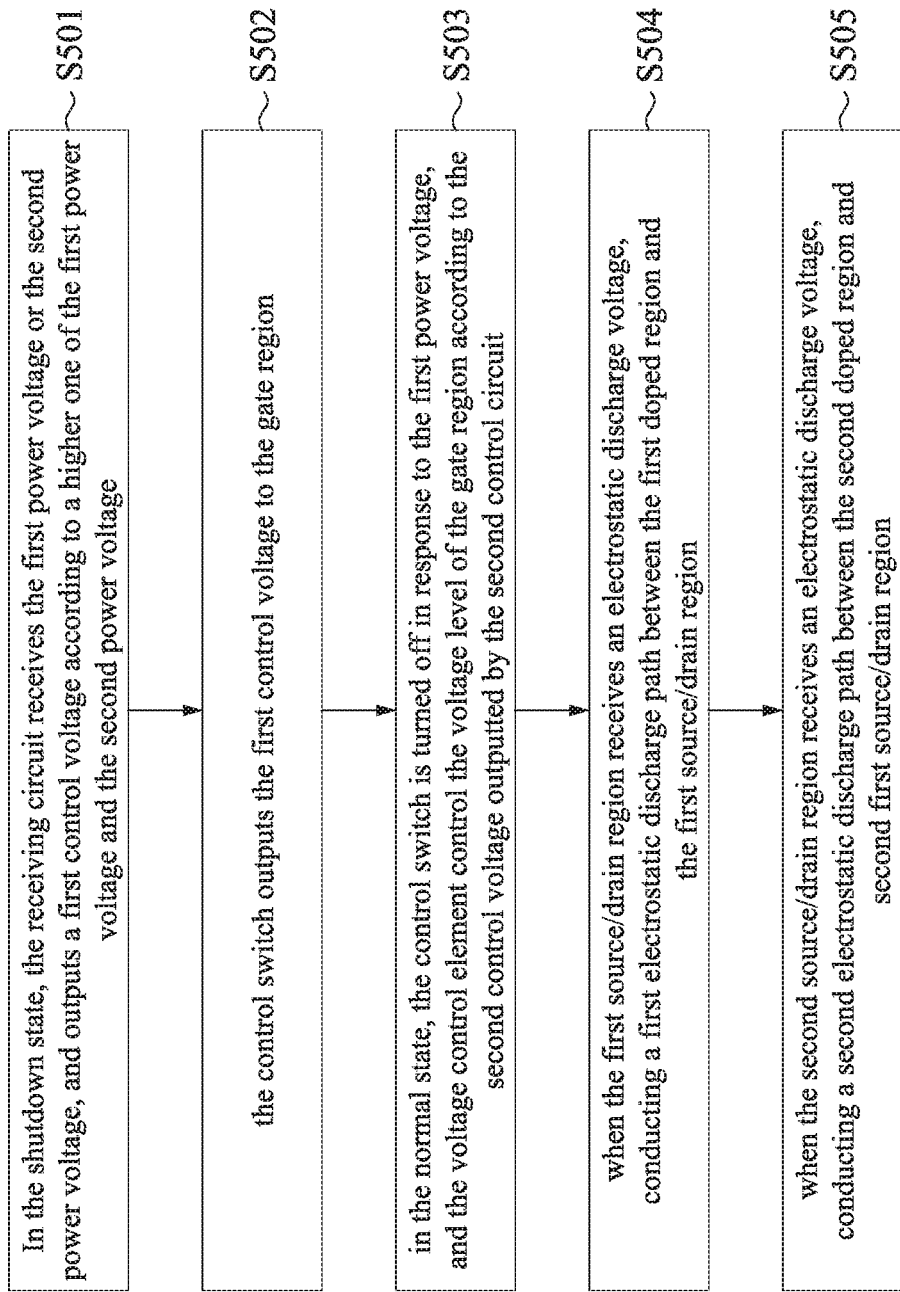
FIG. 5 is a flowchart illustrating an electrostatic discharge protection method in some embodiments of the present disclosure.

FIG. 5 is a flowchart illustrating an electrostatic discharge protection method in some embodiments of the present disclosure. As shown in FIG. 1 and FIG. 5, in the step S501, in the "shutdown state", the receiving circuit 310 receives the first power voltage VDD or the second power voltage VDD0, and outputs the first control voltage V1 according to a higher one of the first power voltage VDD and the second power voltage VDD0. In the step S502, the control switch 320 outputs the first control voltage V1 to the gate region 240 to turn off the voltage control element 200. For example, when the second power voltage VDD0 is greater than the first power voltage VDD, the control switch 320 will be turned on, and the first control voltage V1 will be used as the disabled voltage to maintain the voltage control element 200 turned off.

In the step S503, in the "normal state", the control switch 320 is turned off in response to the first power voltage VDD, and the voltage control element 200 controls the voltage level of the gate region 240 according to the second control voltage V2 output by the second control circuit 400.

In the step S504, when the semiconductor device 100 is in the "electrostatic discharge state", and the first source/drain region 210 receives the electrostatic discharge voltage, the first electrostatic discharge path SCR1 between the first doped region 251 and the first source/drain region 210 is conducted, so that the first electrostatic discharge current flows from the first source/drain region 210 to the first electrostatic discharge region 250, and then outputs outside the voltage control element 200.

In the step S505, when the semiconductor device 100 is in the "electrostatic discharge state", and the second source/drain region 220 receives the electrostatic discharge voltage, the second electrostatic discharge path SCR2 between the second doped region 261 and the second source/drain region 220 is conducted, so that the second electrostatic discharge current flows from the second source/drain region 220 to the second electrostatic discharge region 260, and then is output outside the voltage control element 200.

Referring to FIG. 1 and FIG. 2, the following describes another aspect of the semiconductor device 100. In some embodiments, the semiconductor device 100 includes the voltage control element 200, the first control circuit 300 and the second control circuit 400. The voltage control element 200 includes the first source/drain region 210, the second source/drain region 22 and the gate region 240. The first source/drain region 210 is configured to receive the first power voltage VDD. The second source/drain region 220 is configured to receive the second power voltage VDD0.

As mentioned above, the first control circuit 300 includes the receiving circuit 310 and the control switch 320. The receiving circuit 310 is configured to receive the first power voltage VDD and the second power voltage VDD0, and is further configured to output a first control voltage V1 according to a higher one of the first power voltage VDD and the second power voltage VDD0. The control switch 320 is turned on in response to the first power voltage VDD to output the first control voltage V1 to the gate region 240 of the voltage control element 200. The second control circuit 400 is configured to transmit the second control voltage V2 to the gate region 240 to control the voltage level of the gate region 240.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A semiconductor device, comprising:
    a first source/drain region configured to receive a first power voltage;
    a second source/drain region configured to receive a second power voltage;
    a base region, wherein the first source/drain region and the second source/drain region are formed on the base region;
    a first electrostatic discharge region comprising a first doped region of a first type and a first well of a second type, wherein the first doped region is formed in the first well; and
    a second electrostatic discharge region comprising a second doped region of the first type and a second well of the second type, wherein the second doped region is formed in the second well, and the first source/drain region and the second source/drain region are disposed between the first electrostatic discharge region and the second electrostatic discharge region;
    a first control circuit comprising:
    a receiving circuit configured to receive the first power voltage and the second power voltage, wherein the receiving circuit is further configured to output a first control voltage according to a higher one of the first power voltage and the second power voltage;
    a control switch turned on in response to the first power voltage to output the first control voltage to a gate region of the semiconductor device; and
    a storage element coupled to the base region.

2. The semiconductor device of claim 1, wherein when the first source/drain region receives an electrostatic discharge voltage, the first source/drain region, the base region, the first well and the first doped region form a first electrostatic discharge path.

3. The semiconductor device of claim 1, wherein when the second source/drain region receives an electrostatic discharge voltage, the second source/drain region, the base region, the second well and the second doped region form a second electrostatic discharge path.

4. The semiconductor device of claim 1, wherein the first well and the second well are formed in the base region.

5. The semiconductor device of claim 1, wherein the first well and the second well are implemented by a same doped well region.

6. The semiconductor device of claim 5, wherein the base region is formed in the same doped well region.

7. The semiconductor device of claim 1, further comprising a third well of the first type and a fourth well of the first type, wherein the first doped region is coupled to the first well through the third well, and the second doped region is coupled to the second well through the fourth well.

8. The semiconductor device of claim 1, further comprising a second control circuit, wherein the second control circuit is configured to transmit a second control voltage to the gate region to control a voltage level of the gate region.

9. The semiconductor device of claim 1, wherein the receiving circuit comprises:
    a first switch element turned on in response to the first power voltage, wherein a first terminal of the first switch element is configured to receive the second power voltage, and a second terminal of the first switch element is coupled to the control switch; and
    a second switch element turned on in response to the second power voltage, wherein a first terminal of the second switch element is configured to receive the first power voltage, and a second terminal of the second switch element is coupled to the control switch.

10. An electrostatic discharge protection method, comprising:
    conducting a first electrostatic discharge path between a first doped region of a first type and a first source/drain region of a second type, wherein a base region of the first type and a first well of the second type are coupled between the first doped region and the first source/drain region; and conducting a second electrostatic discharge path between a second doped region of the first type and a second source/drain region of the second type, wherein the base region and a second well of the second type are coupled between the second doped region and the second source/drain region;

wherein the electrostatic discharge protection method further comprises:

receiving a first power voltage or a second power voltage by a receiving circuit;

outputting a higher one of the first power voltage and the second power voltage as a first control voltage; and outputting the first control voltage in response to the first power voltage to a gate region between the first source/drain region and the second source/drain region by a control switch.

11. The electrostatic discharge protection method of claim 10, wherein the first well and the second well are formed in the base region.

12. The electrostatic discharge protection method of claim 10, wherein the first well and the second well are implemented by a same doped well region.

13. The electrostatic discharge protection method of claim 12, wherein the base region is formed in the same doped well region.

14. The electrostatic discharge protection method of claim 10, further comprising:

turning on the control switch according to the first power voltage to output a disable voltage to the gate region when the second power voltage is greater than the first power voltage.

15. A semiconductor device, comprising:

a voltage control element comprising a first source/drain region, a second source/drain region and a gate region, wherein the first source/drain region is configured to receive a first power voltage, and the second source/drain region is configured to receive a second power voltage; and a first control circuit comprising:

a receiving circuit configured to receive the first power voltage and the second power voltage, wherein the receiving circuit is further configured to output a higher one of the first power voltage and the second power voltage as a first control voltage; and a control switch turned on in response to the first power voltage to output the first control voltage to the gate region of the voltage control element.

16. The semiconductor device of claim 15, wherein the receiving circuit comprises:

a first switch element turned on in response to the first power voltage, wherein a first terminal of the first switch element is configured to receive the second power voltage, and a second terminal of the first switch element is coupled to the control switch; and a second switch element turned on in response to the second power voltage, wherein a first terminal of the second switch element is configured to receive the first power voltage, and a second terminal of the second switch element is coupled to the control switch.

17. The semiconductor device of claim 16, further comprising a second control circuit, wherein the second control circuit is configured to transmit a second control voltage to the gate region to control a voltage level of the gate region.

* * * * *